(12) United States Patent
Tang et al.

(10) Patent No.: US 7,050,290 B2
(45) Date of Patent: May 23, 2006

(54) INTEGRATED CAPACITOR

(75) Inventors: Denny Tang, Saratoga, CA (US);
Wen-Chin Lin, Hsin-Chu (TW);
Li-Shyue Lai, Jhube (TW); Chun-Hon Chen, Jhubei (TW); Chung-Long Chang, Win-Lin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/768,916

(22) Filed: Jan. 30, 2004

(65) Prior Publication Data

US 2005/0168914 A1  Aug. 4, 2005

(51) Int. Cl.
*H01G 4/008* (2006.01)
*H01G 4/20* (2006.01)

(52) U.S. Cl. ........................ 361/312; 361/305
(58) Field of Classification Search .............. 361/301.4, 361/303–305, 306.1, 306.2, 311–313; 257/532, 257/295–310
See application file for complete search history.

(56) References Cited

U.S. PATENT DOCUMENTS

| | | | | |
|---|---|---|---|---|
| 5,208,725 A | * | 5/1993 | Akcasu ........................ 361/313 |
| 5,622,893 A | * | 4/1997 | Summerfelt et al. ........ 438/396 |
| 5,814,850 A | * | 9/1998 | Iwasa .......................... 257/296 |
| 5,880,921 A | | 3/1999 | Tham et al. ................. 361/233 |
| 5,907,782 A | * | 5/1999 | Wu ............................. 438/398 |
| 5,939,766 A | * | 8/1999 | Stolmeijer et al. ........... 257/534 |
| 5,960,293 A | * | 9/1999 | Hong et al. .................. 438/397 |
| 6,251,740 B1 | | 6/2001 | Johnson et al. ............. 438/381 |
| 6,331,460 B1 | | 12/2001 | Kizilyalli et al. ............ 438/243 |
| 6,335,557 B1 | | 1/2002 | Kizilyalli et al. ............ 257/532 |
| 6,383,858 B1 | | 5/2002 | Gupta et al. ................ 438/238 |
| 6,385,033 B1 | * | 5/2002 | Javanifard et al. ........ 361/306.2 |
| 6,410,954 B1 | * | 6/2002 | Sowlati et al. .............. 257/306 |
| 6,563,191 B1 | | 5/2003 | Casey et al. ................ 257/532 |
| 6,625,006 B1 | * | 9/2003 | Aram et al. ................. 361/313 |
| 2004/0018697 A1 | * | 1/2004 | Chung ........................ 438/437 |
| 2004/0125538 A1 | * | 7/2004 | Carstensen .................. 361/305 |

* cited by examiner

*Primary Examiner*—Eric W. Thomas
(74) *Attorney, Agent, or Firm*—Haynes and Boone, LLP

(57) ABSTRACT

A new capacitor device having two terminals is achieved. The device comprises a plurality of first conductive lines overlying a substrate. Each of the first conductive lines is connected to one of the capacitor device terminals. The adjacent first conductive lines are connected to opposite terminals. The first conductive lines comprise a plurality of conductive materials. A plurality of second conductive lines overlie the plurality of first conductive lines. Each of the second conductive lines is connected to one of the capacitive device terminals. Adjacent second conductive lines are connected to opposite terminals. Any second conductive line overlying any first conductive line is connected to an opposite terminal. The second conductive lines comprises a plurality of conductive materials. A first dielectric layer overlies the substrate and lies between the adjacent first conductive lines. A second dielectric layer lies between the first conductive lines and the second conductive lines.

21 Claims, 8 Drawing Sheets

INTEGRATED CAPACITOR

BACKGROUND OF THE INVENTION (1) Field of the Invention

The invention relates to an integrated circuit device, and, more particularly, to a method to form a capacitor in the manufacture of an integrated circuit device.

(2) Description of the Prior Art

Capacitors are frequently used in integrated circuit devices. Large value capacitors are useful in radio frequency (RF) circuits such as used for filtering or signal processing. Due to trends toward higher levels of integration, it is desirable to integrate large value capacitors onto integrated circuit devices. Various types of integrated capacitors have been devised. In particular, metal-on-metal (MOM) and polysilicon-on-polysilicon (POP) capacitors are formed on integrated circuit devices. In either case, a dielectric layer separates the conductive layers. A particular challenge in the art of integrated circuit manufacture is the formation of large value capacitors. The formation of such capacitors is a key objective of the present invention.

Several prior art inventions relate to integrated circuit capacitors. U.S. Pat. No. 6,383,858 B1 to Gupta et al discloses a method to form an interdigitated capacitor. The method discloses forming metal lines by metal deposition and patterning. U.S. Pat. No. 6,335,557 B1 to Kizilyalli et al and U.S. Pat. No. 6,331,460 B1 to Kizilyalli et al describe a method to form a metal-oxide-metal (MOM) capacitor using metal silicide as a barrier. U.S. Pat. No. 5,880,921 to Tham et al describes a switched capacitor bank using micro electromechanical system (MEMS) technology. U.S. Pat. No. 6,563,191 B1 to Casey et al discloses an interdigitated capacitor structure with a dielectric overlay. The capacitor lines are formed by patterning a deposited conductor layer. U.S. Pat. No. 6,251,740 B1 to Johnson et al teaches a method to form an interdigitated capacitor. U-shaped structures are formed in the underlying dielectric layer. However, chemical mechanical polishing is taught against as a means to pattern the conductive layers for the electrodes.

SUMMARY OF THE INVENTION

A principal object of the present invention is to provide an effective and very manufacturable method to form a high, unit area capacitor in the manufacture of an integrated circuit device.

A further object of the present invention is to provide a high, unit area capacitor while using minimal area of integrated circuit.

A yet further object of the present invention is to provide a high, unit area capacitor while using standard logic processes.

A yet further object of the present invention is to provide a high, unit area capacitor that is compatible with damascene technology.

A yet further object of the present invention is to provide a high, unit area capacitor that is compatible with multiple material dielectric technology.

A yet further object of the present invention is to provide a high, unit area capacitor that is compatible with multiple material interconnect layer technology.

In accordance with the objects of this invention, a capacitor device having two terminals is achieved. The device comprises a plurality of first conductive lines overlying a substrate. Each of the first conductive lines is connected to one of the capacitor device terminals. The adjacent first conductive lines are connected to opposite terminals. The first conductive lines comprise a plurality of conductive materials. A plurality of second conductive lines overlie the plurality of first conductive lines. Each of the second conductive lines is connected to one of the capacitive device terminals. Adjacent second conductive lines are connected to opposite terminals. Any second conductive line overlying any first conductive line is connected to an opposite terminal. The second conductive lines comprise a plurality of conductive materials. A first dielectric layer overlies the substrate and lies between the adjacent first conductive lines. A second dielectric layer lies between the first conductive lines and the second conductive lines.

Also in accordance with the objects of this invention, a capacitor device having two terminals is achieved. The device comprises a plurality of first conductive lines overlying a substrate. Each of the first conductive lines is connected to one of the capacitor device terminals. The adjacent first conductive lines are connected to opposite terminals. The first conductive lines comprise a plurality of conductive materials. A plurality of second conductive lines overlies the plurality of first conductive lines. Each of the second conductive lines is connected to one of the capacitive device terminals. Adjacent second conductive lines are connected to opposite terminals. Any second conductive line overlying any first conductive line is connected to an opposite terminal. The second conductive lines comprise a plurality of conductive materials. A first dielectric layer overlies the substrate and lies between the adjacent first conductive lines. The first dielectric layer comprises a plurality of materials. A second dielectric layer lies between the first conductive lines and the second conductive lines. The second dielectric layer comprises a plurality of materials.

Also in accordance with the objects of this invention, a method of forming a two terminal capacitor device in the manufacture of an integrated circuit device is achieved. The method comprises forming a first dielectric layer overlying a substrate. The first dielectric layer is patterned to form openings. A first conductive layer is deposited overlying the first dielectric layer and filling the openings. The first conductive layer is planarized to the top surface of the first dielectric layer to thereby form a plurality of first conductive lines. Each of the first conductive lines is connected to one of the capacitor device terminals. The adjacent first conductive lines are connected to the opposite terminals. A second dielectric layer is deposited overlying the first conductive lines and the first dielectric layer. A second conductive layer is deposited. The second conductive layer is patterned to form a plurality of second conductive lines. Each of the second conductive lines is connected to one of the capacitive device terminals. Adjacent second conductive lines are connected to opposite terminals. Any second conductive line overlying any first conductive line is connected to an opposite terminal.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose methods to form high, unit area capacitors in the manufacture of an integrated circuit device. Further, several such capacitor devices are disclosed. It should be clear to those experienced in the art that the present invention can be applied and extended without deviating from the scope of the present invention.

Figure 1:
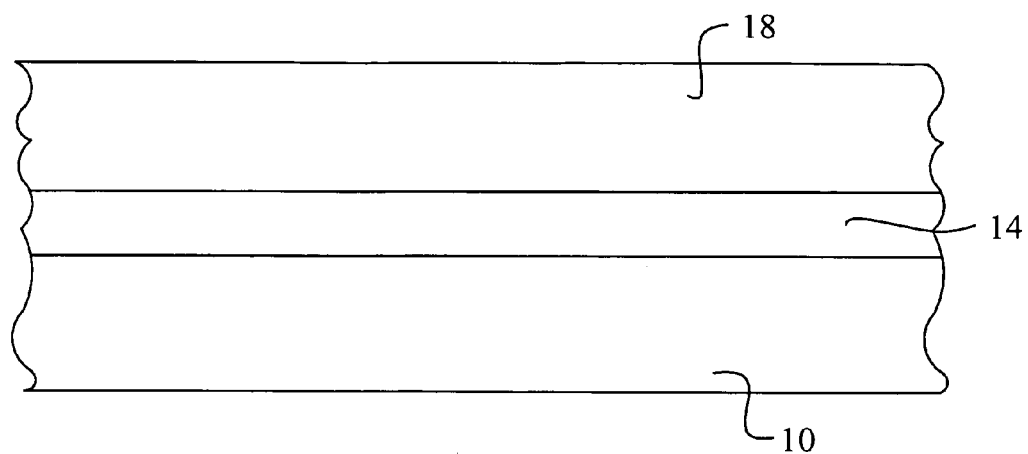
FIGS. 1 through 8 illustrate a first preferred embodiment of the present invention.

Referring now to FIGS. 1 through 8, a first preferred embodiment of the present invention is illustrated. Several important features of the present invention are shown and discussed below. In the first embodiment, an interdigitated capacitor structure is formed using damascene technology. Referring particularly to FIG. 1, a substrate 10 is provided. The substrate 10 may comprise any of the typical materials known in the art. Preferably, the substrate 10 comprises a semiconductor material such as monocrystalline silicon. The substrate 10 may further comprises isolation layers, such as oxide, found in silicon on insulator (SOI) wafers. Typically, the substrate 10 will further comprise a plurality of active and passive devices, interconnections, and isolations, not shown, that have been formed as part of an integrated circuit design prior to the first illustrated step in the method. The method of the present invention is performed in the part of integrated circuit manufacture commonly referred to as "back end" processing. In the "back end" steps, various levels of conductive lines are formed overlying the substrate to provide interconnections within the circuit and between the circuit and outside signal.

As a first important feature of the present invention, a first dielectric layer 14 and 18 is formed overlying the substrate 10. The first dielectric layer 14 and 18 of the first embodiment is preferably formed from two layers, an etch stopping layer 14 and a low k dielectric layer 18. The etch stopping layer 14 comprises a material that exhibits a slow etching rate in the etching process used for patterning the low k dielectric layer 18. For example, the etch stopping layer 14 may comprise silicon carbide or silicon nitride that is deposited overlying the substrate 10. A chemical vapor deposition (CVD) process may be used to deposit the etch stopping layer 14. Alternatively, physical vapor deposition (PVD) may be used.

The low k dielectric layer 18 may comprise materials such as TEOS oxide, fluorine-containing oxide, or carbon-containing oxide. Such materials may be formed by CVD, PVD, or by spin-on-coating. In this preferred arrangement, the first dielectric layer 14 and 18 comprises two, different materials. In one embodiment, at least one of the materials is substantially oxygen-free. For example, the etch stopping layer 14 materials, silicon carbide or silicon nitride, are substantially oxygen-free Alternatively, the first dielectric layer 14 and 18 may comprise a single material. This single material may comprise an oxygen-free material, such as silicon carbide or silicon nitride, or may comprise a hybrid material, such as fluorine-containing oxide, or carbon-containing oxide.

Figure 2:
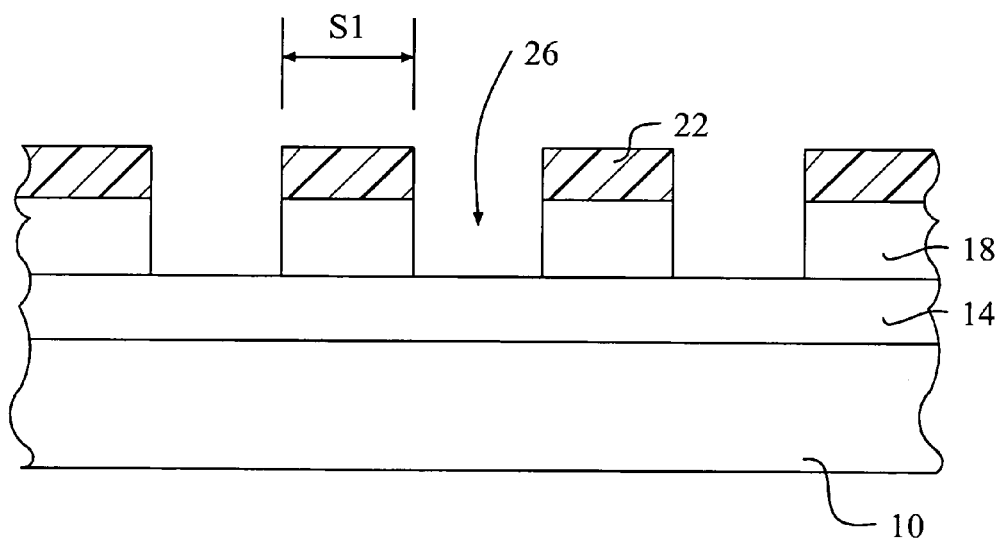

Referring now to FIG. 2, an important feature of the first embodiment is illustrated. The first dielectric layer 14 and 18 is patterned to form openings. In the example case, since the first dielectric layer 14 and 18 comprises both the low k dielectric layer 18 and the etch stopping layer 14, only the low k dielectric layer 18 is etched through. The patterning step is preferably performed using a lithography-etch sequence. For example, a photoresist layer 22 is formed overlying the first dielectric layer 14 and 18. The photoresist layer 22 is patterned by exposing the photoresist layer 22 to actinic light through a mask to cause the exposed photoresist layer 22 to become cross-linked. The unexposed photoresist layer 22 is then removed using a developer to thereby expose the underlying first dielectric layer 14 and 18. The exposed first dielectric layer 14 and 18 is then etched using, for example, a dry etching process as is well-known in the art. Finally, the remaining photoresist layer 22 is removed by, for example, oxygen ashing. As a result of the patterning step, openings 26 are formed in the low k dielectric layer 18 for planned interconnect lines. The underlying etch stopping layer 14 stops the etching process from encroaching upon the substrate 10 as shown.

The low k dielectric layer 18 between the openings 26 forms the spaces S1 between the planned lines. According to one embodiment of the present invention, the spaces S1 between adjacent first conductive lines are less than about 1 micron. According to another embodiment of the present invention, the spaces S1 between adjacent first conductive lines are between about 0.05 microns and about 1.2 microns.

Figure 3:
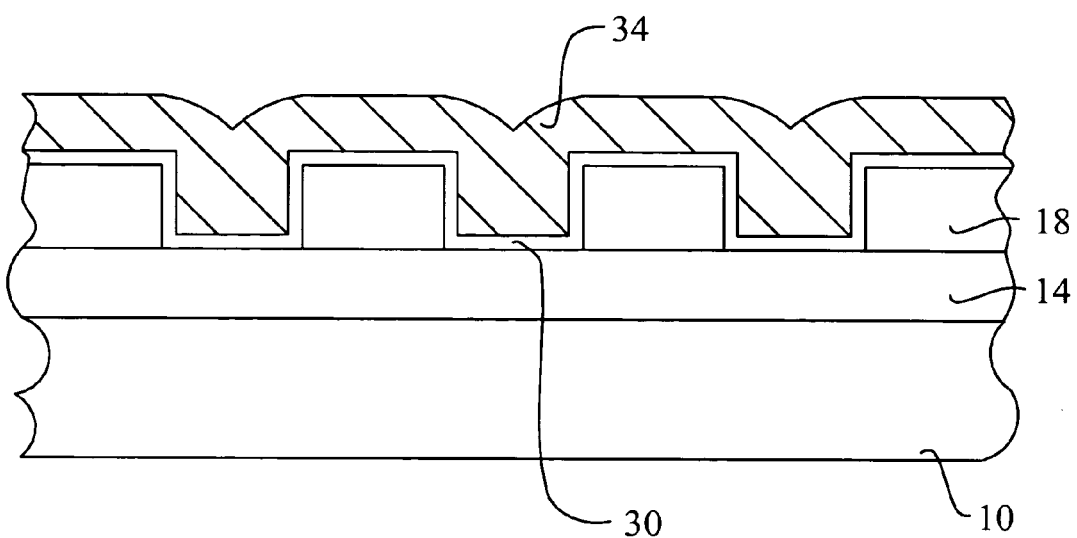

Referring now to FIG. 3, a first conductive layer 30 and 34 is deposited overlying the first dielectric layer 14 and 18 and filling the openings. The first conductive layer 30 and 34 of the first embodiment preferably comprises at least two materials and, more preferably, comprises a first liner layer 30 and a first metal layer 34. In the preferred case, the first metal layer 34 comprises copper. It is known in the art that copper can diffuse, under normal processing conditions, into the low k dielectric layer 18. Such diffusion causes several problems in the manufacture and in the reliable performance of the resulting structure. To prevent said diffusion, a liner layer 30 is used to form a barrier between the copper 34 and the low k dielectric layer 18. For example, a titanium nitride (TiN) may be used as a liner layer 30. This liner layer 30 may be deposited by CVD or PVD.

The first metal layer 34 preferably comprises copper that is deposited by CVD, PVD, or by a plating process. Alternatively, the first conductor layer 34 and 30 may comprise aluminum or silicon or combinations of copper, aluminum, or silicon. The liner layer 30 is only used if a diffusion barrier is needed. As a key feature, the first metal layer 34 is deposited such that the openings in the first dielectric layer 18 are completely filled.

Figure 4:
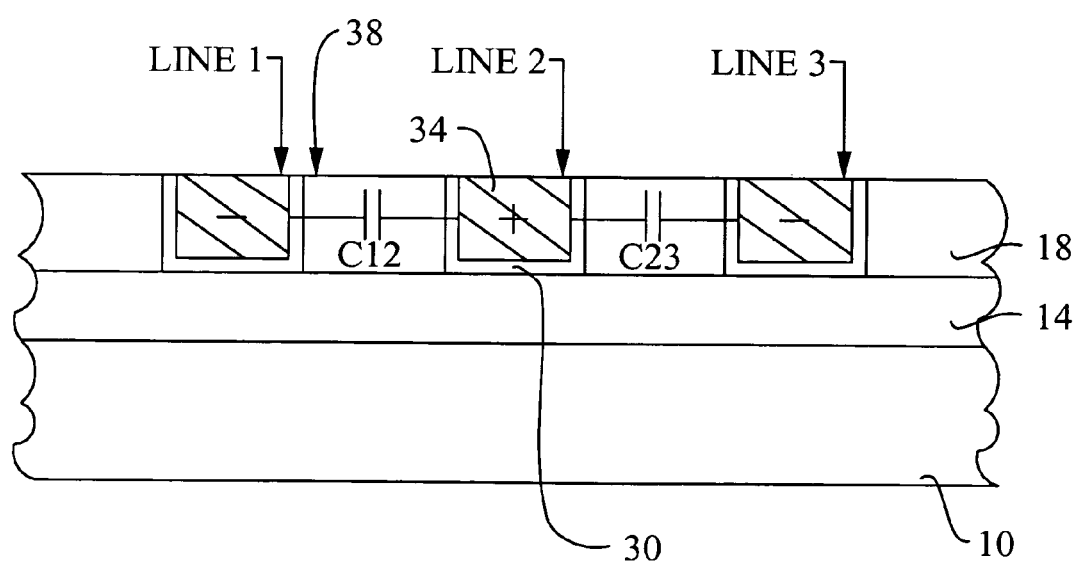

Referring now to FIG. 4, the first conductive layer 34 and 30 is planarized to the top surface 38 of the first dielectric layer 18 to thereby form a plurality of first conductive lines, LINE1, LINE2, LINE3, etc. This planarization step may be performed using an etching process or using a chemical mechanical polishing (CMP) process. Each of the first conductive lines 34 is connected to one terminal, not shown, of the planned capacitor devices. For example, LINE1 is connected to the negative (−) terminal, LINE2 is connected to the positive (+) terminal, and LINE3 is connected to the negative terminal (−). Further, note that the adjacent first conductive lines 34 are connected to the opposite terminals. In this way, the interaction between each line with the two lines adjacent to that line creates two capacitors. For example, a first capacitor C12 is formed between LINE2 and LINE1 while a second capacitor C23 is formed between LINE2 and LINE3. At this point, a single level, interdigitated capacitor is formed.

Figure 5:
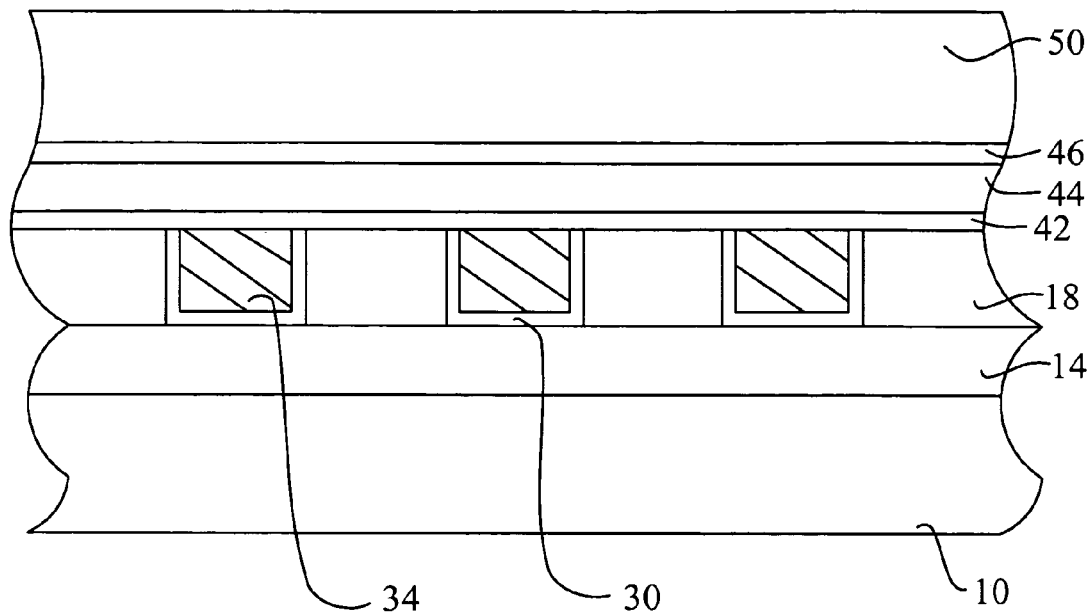

Referring now to FIG. 5, the first embodiment method is extended to form a second level of capacitor lines. A second dielectric layer 42, 44, 46, and 50 is deposited overlying the first conductive lines 34 and the first dielectric layer 14 and 18. The second dielectric layer 42, 44, 46, and 50 preferably comprises several materials. More preferably, the second dielectric layer 42, 44, 46, and 50 comprises a barrier layer 42, a second low k dielectric layer 44, a second etch stopping layer 46, and a top dielectric layer 50. The second dielectric layer 42, 44, 46, and 50 is deposited using CVD, PVD, spin-on coating or combinations thereof.

The barrier layer 42 again serves a similar purpose as the liner layer 30. If copper is used for the first metal layer 34, then the barrier layer 42 prevents copper out-diffusion into the overlying second low k dielectric layer 74. The barrier layer 42 may comprise, for example, titanium nitride. The second low k dielectric layer 74 preferably comprises materials such as TEOS oxide, fluorine-containing oxide, or carbon-containing oxide. Such materials may be formed by CVD, PVD, or by spin-on-coating. In this second preferred arrangement, the second dielectric layer 42 and 74 comprises at least two, different materials. In one embodiment, at least one of the materials is substantially oxygen-free. Alternatively, the second dielectric layer 42 and 74 may comprise a single material. This single material may comprise an oxygen-free material, such as silicon carbide or silicon nitride, or may comprise a hybrid material, such as fluorine-containing oxide, or carbon-containing oxide. A second conductive layer 78 is deposited overlying the second dielectric layer 74 and 42. The second metal layer 78 preferably comprises copper that is deposited by CVD, PVD, or by a plating process. Alternatively, the second conductor layer 78 may comprise aluminum or silicon or combinations of copper, aluminum, or silicon.

Figure 6:
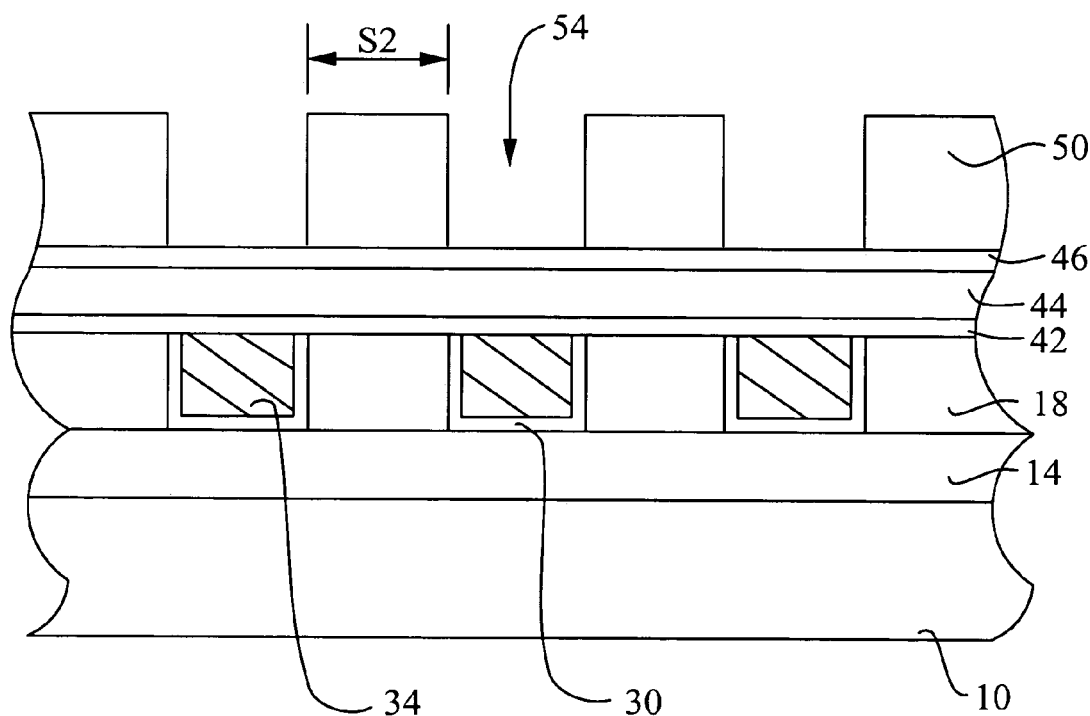

Referring now to FIG. 6, the second dielectric layer 42, 44, 46, and 50 is patterned to form openings 54 for planned second level lines. In the example case, since the second dielectric layer 50 and 46 comprises both a third low k dielectric layer 50 and a second etch stopping layer 46, only the third low k dielectric layer 50 is etched through. The patterning step is preferably performed using a lithography-etch sequence as in the first level. As a result of the patterning step, openings 54 are formed in the third low k dielectric layer 50 for planned interconnect lines. The underlying second etch stopping layer 46 stops the etching process.

The third low dielectric layer 50 between the openings 54 forms the spaces S2 between the planned lines. According to one embodiment of the present invention, the spaces S2 between adjacent second conductive lines are less than about 1 micron. According to another embodiment of the present invention, the spaces S2 between adjacent second conductive lines are between about 0.05 microns and about 1.2 microns. In addition, the first level spaces S1 and the second level spaces S2 do not have to be the same value.

Figure 7:
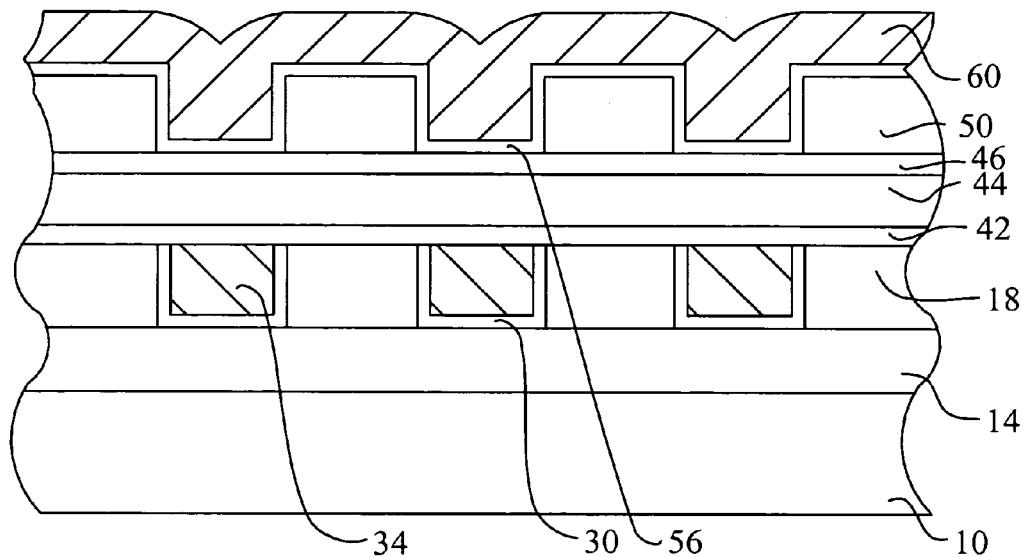

Referring now to FIG. 7, a second conductive layer 60 and 56 is deposited overlying the second dielectric layer 50, 46, 44, and 42 and filling the openings. The second conductive layer 60 and 56 of the first embodiment preferably comprises at least two materials and, more preferably, comprises a second liner layer 56 and a second metal layer 60. In the preferred case, the second metal layer 60 comprises copper. To prevent copper diffusion, the liner layer 56 is used to form a barrier between the copper 60 and the third low k dielectric layer 50. For example, a titanium nitride (TiN) may be used as a liner layer 56. This liner layer 56 may be deposited by CVD or PVD.

The second metal layer 60 preferably comprises copper that is deposited by CVD, PVD, or by a plating process. Alternatively, the second conductor layer 60 and 56 may comprise aluminum or silicon or combinations of copper, aluminum, or silicon. The liner layer 56 is used if a diffusion barrier is needed. As a key feature, the second metal layer 60 is deposited such that the openings in the second dielectric layer 50, 46, 44, and 42 are completely filled.

Figure 8:
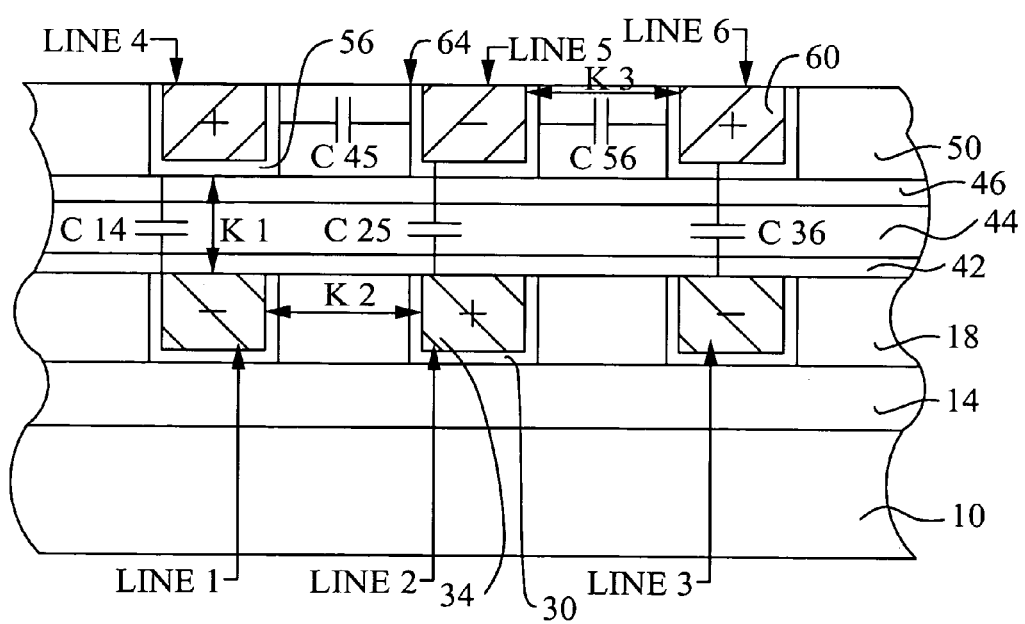

Referring now to FIG. 8, the second conductive layer 60 and 56 is planarized to the top surface 64 of the second dielectric layer 50 to thereby form a plurality of second conductive lines, LINE4, LINE5, LINE6, etc. This planarization step may be performed using an etching process or using a chemical mechanical polishing (CMP) process. Each of the second conductive lines 60 is connected to one terminal, not shown, of the planned capacitor devices. For example, LINE4 is connected to the positive (+) terminal, LINE5 is connected to the negative (−) terminal, and LINE6 is connected to the positive (+) terminal. Further, note that the adjacent second conductive lines 60 are connected to the opposite terminals. In this way, the interaction between each line 60 with the two lines adjacent to that line creates two capacitors. For example, a first capacitor C45 is formed between LINE5 and LINE4 while a second capacitor C56 is formed between LINE5 and LINE6.

In addition to the interdigitated capacitors formed on each level of the structure, additional interdigitated capacitors are formed between the levels of the structure. As an additional feature, any second conductive line 60 overlying any first conductive line 34 is connected to an opposite terminal from that first conductive line 34. Therefore, LINE4 is connected to the positive terminal (+) while underlying LINE1 is connected to the negative terminal (−). Using this convention, additional capacitors are created between the lines on each layer. For example, capacitor C14 is between LINE1 and LINE4, capacitor C25 is between LINE2 and LINE5, and capacitor C36 is between LINE3 and LINE6.

As an additional feature, note that the design features several dielectric coefficients, K1, K2, and K3. The first dielectric coefficient K1 is between the upper lines 60 and the lower lines 34. The second dielectric coefficient K2 is between adjacent first conductive lines 34. The third dielectric coefficient K3 is between adjacent second conductive lines 60. In one embodiment of the present invention, the first dielectric coefficient K1 and the second dielectric coefficient K2 have different values. In another embodiment of the present invention, the first conductive lines are spaced S1 less than about 1 micron while the second dielectric coefficient K2 is less than about 4. In another embodiment of the present invention, the second dielectric coefficient K2 is less than about 4.5. In another embodiment of the present invention, the second conductive lines are spaced S2 less than about 1 micron while the first dielectric coefficient K1 is less than about 4. In another embodiment of the present invention, the second dielectric coefficient K2 is less than about 4.5.

The resulting interdigitated capacitor device of the first embodiment can now be described. The device comprises a plurality of first conductive lines 34 overlying a substrate 10. Each of the first conductive lines 34 is connected to one of the capacitor device terminals (−) or (+). The adjacent first conductive lines 34 are connected to opposite terminals. The first conductive lines 34 comprise a plurality of conductive materials 30 and 34. A plurality of second conductive lines 60 overlies the plurality of first conductive lines 34. Each of the second conductive lines 60 is connected to one of the capacitive device terminals (−) or (+). Adjacent second conductive lines 60 are connected to opposite terminals. Any second conductive line 60 overlying any first conductive line 34 is connected to an opposite terminal. The second conductive lines 60 comprise a plurality of conductive materials 56 and 60. A first dielectric layer 18 and 14 overlies the substrate 10 and lies between the adjacent first conductive lines 34. A second dielectric layer 42 and 44 lies between the first conductive lines 34 and the second conductive lines 60.

Figure 9:
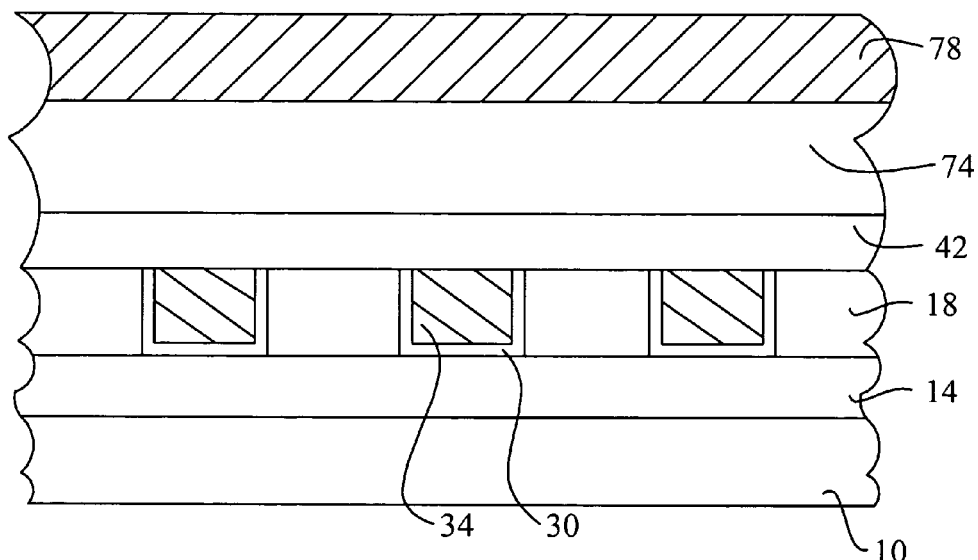
FIGS. 9 and 10 illustrate a second preferred embodiment of the present invention.
Figure 10:
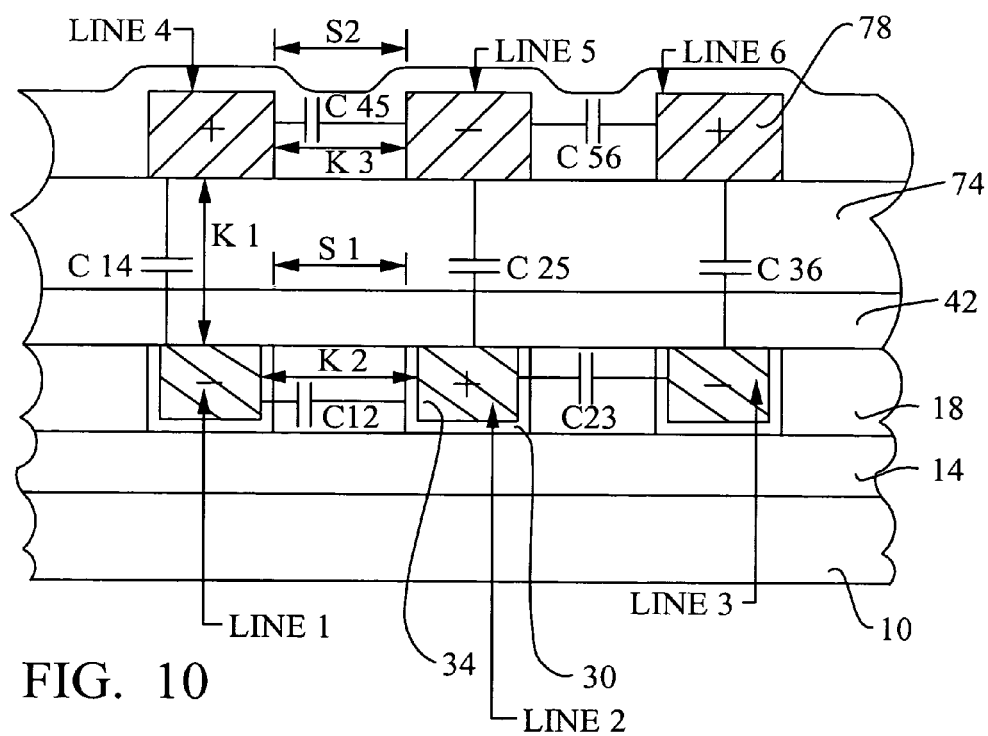

Referring now to FIGS. 9 and 10, a second preferred embodiment of the present invention is illustrated. In this embodiment, the first conductive lines 34 are formed using the damascene process of the first embodiment. However, the second conductive lines 78 are formed using a metal etch. Following the formation of the first conductive lines 34, a second dielectric layer 42 and 74 is formed. The second dielectric 42 and 74 is deposited overlying the first conductive lines 34 and the first dielectric layer 14 and 18. The second dielectric layer 42 and 74 preferably comprises several materials. More preferably, the second dielectric layer 42 and 74 comprises a barrier layer 42 and a second low k dielectric layer 74.

The barrier layer 42 again serves a similar purpose as the liner layer 30. If copper is used for the first metal layer 34, then the barrier layer 42 prevents copper out-diffusion into the overlying second low k dielectric layer 44. The barrier layer 42 may comprise, for example, titanium nitride. The second low dielectric layer 74 preferably comprises materials such as TEOS oxide, fluorine-containing oxide, or carbon-containing oxide. Such materials may be formed by CVD, PVD, or by spin-on-coating. In this second preferred arrangement, the second dielectric layer 42 and 74 comprises at least two, different materials. In one embodiment, at least one of the materials is substantially oxygen-free. Alternatively, the second dielectric layer 42 and 74 may comprise a single material. This single material may comprise an oxygen-free material, such as silicon carbide or silicon nitride, or may comprise a hybrid material, such as fluorine-containing oxide, or carbon-containing oxide. A second conductive layer 78 is deposited overlying the second dielectric layer 74 and 42. The second metal layer 78 preferably comprises copper that is deposited by CVD, PVD, or by a plating process. Alternatively, the second conductor layer 78 may comprise aluminum or silicon or combinations of copper, aluminum, or silicon.

Referring now to FIG. 10, the second conductive layer 78 is patterned to thereby form a plurality of second conductive lines 78, LINE4, LINE5, LINE6, etc. This patterning step may be performed using a lithography and etch sequence as described above. Each of the second conductive lines 78 is connected to one terminal, not shown, of the planned capacitor devices. For example, LINE4 is connected to the positive (+) terminal, LINE5 is connected to the negative (−) terminal, and LINE6 is connected to the positive (+) terminal. Further, note that the adjacent second conductive lines 78 are connected to the opposite terminals. In this way, the interaction between each line 78 with the two lines adjacent to that line 78 creates two capacitors. For example, a first capacitor C45 is formed between LINE5 and LINE4 while a second capacitor C56 is formed between LINE5 and LINE6.

In addition to the interdigitated capacitors formed on each level of the structure, additional interdigitated capacitors are formed between the levels of the structure. As an additional feature, any second conductive line 78 overlying any first conductive line 34 is connected to an opposite terminal from that first conductive line 34. Therefore, LINE4 is connected to the positive terminal (+) while underlying LINE1 is connected to the negative terminal (−). Using this convention, additional capacitors are created between the lines on each layer. For example, capacitor C14 is between LINE1 and LINE4, capacitor C25 is between LINE2 and LINE5, and capacitor C36 is between LINE3 and LINE6.

As an additional feature, note that the design features several dielectric coefficients, K1, K2, and K3. The first dielectric coefficient K1 is between the upper lines 60 and the lower lines 34. The second dielectric coefficient K2 is between adjacent first conductive lines 34. The third dielectric coefficient K3 is between adjacent second conductive lines 78. In one embodiment of the present invention, the first dielectric coefficient K1 and the second dielectric coefficient K2 have different values. In another embodiment of the present invention, the first conductive lines are spaced S1 less than about 1 micron while the second dielectric coefficient K2 is less than about 4. In another embodiment of the present invention, the second dielectric coefficient K2 is less than about 4.5. In another embodiment of the present invention, the second conductive lines are spaced S2 less than about 1 micron while the first dielectric coefficient K1 is less than about 4. In another embodiment of the present invention, the second dielectric coefficient K2 is less than about 4.5. Finally, in another embodiment, the spaces S1 between adjacent first conductive lines 34 and the spaces S2 between adjacent second conductive lines 78 may be of different values.

The resulting interdigitated capacitor device of the second embodiment can now be described. The device comprises a plurality of first conductive lines 34 overlying a substrate 10. Each of the first conductive lines 34 is connected to one of the capacitor device terminals (−) or (+). The adjacent first conductive lines 34 are connected to opposite terminals. The first conductive lines 34 comprise a plurality of conductive materials 30 and 34. A plurality of second conductive lines 78 overlies the plurality of first conductive lines 34. Each of the second conductive lines 78 is connected to one of the capacitive device terminals (−) or (+). Adjacent second conductive lines 60 are connected to opposite terminals. Any second conductive line 60 overlying any first conductive line 34 is connected to an opposite terminal. The second conductive lines 78 comprise a plurality of conductive materials 56 and 60. A first dielectric layer 18 and 14 overlies the substrate 10 and lies between the adjacent first conductive lines 34. A second dielectric layer 42 and 74 lies between the first conductive lines 34 and the second conductive lines 78.

Figure 11:
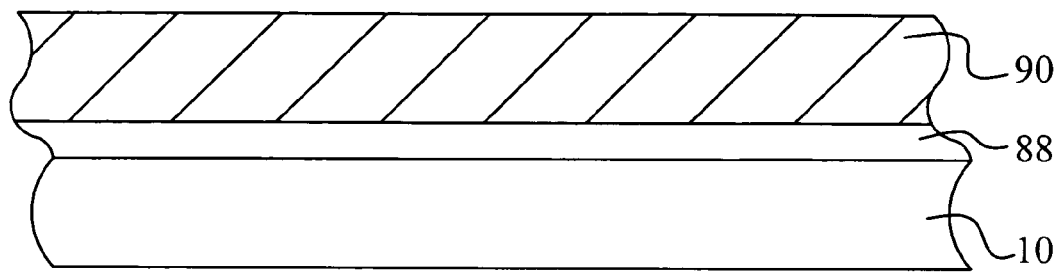
FIGS. 11 through 14 illustrate a third preferred embodiment of the present invention.

Referring now to FIGS. 11 through 14, a third embodiment of the present invention is illustrated. In the third embodiment, both the first and second conductive lines are formed using metal etching. Referring particularly to FIG. 11, a buffer dielectric layer 88 is formed to separate the substrate 10 from the subsequently formed first conductive layer 90. A first conductive layer 90 is deposited overlying the buffer dielectric layer 88. The first conductive layer 90 preferably comprises copper that is deposited by CVD, PVD, or by a plating process. Alternatively, the first conductor layer 90 may comprise aluminum or silicon or combinations of copper, aluminum, or silicon.

Figure 12:
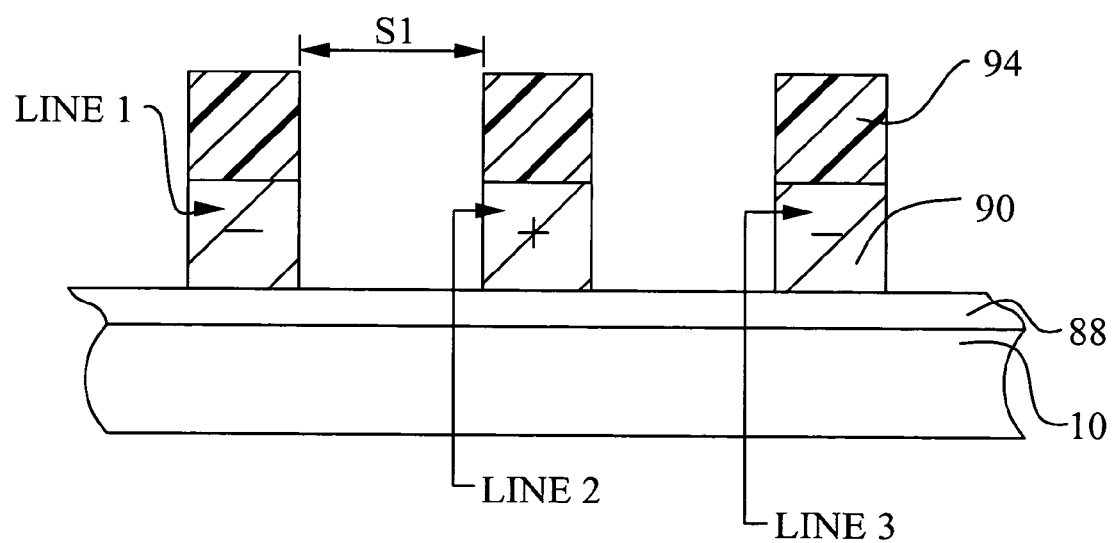

Referring now to FIG. 12, the first conductive layer 90 is patterned to thereby form a plurality of first conductive lines 90, LINE1, LINE2, LINE3, etc. This patterning step may be performed using a lithography and etching process as described above, such as by using a resist layer 94. Each of the first conductive lines 90 is connected to one terminal, not shown, of the planned capacitor devices. For example, LINE1 is connected to the negative (−) terminal, LINE2 is connected to the positive (+) terminal, and LINE3 is connected to the negative (−) terminal. Further, note that the adjacent first conductive lines 90 are connected to the opposite terminals. According to one embodiment of the present invention, the spaces S1 between adjacent first conductive lines are less than about 1 micron. According to another embodiment of the present invention, the spaces S1 between adjacent first conductive lines are between about 0.05 microns and about 1.2 microns. In this way, the interaction between each line 90 with the two lines 90 adjacent to that line creates two capacitors. For example, a first capacitor C12 is formed between LINE2 and LINE1 while a second capacitor C23 is formed between LINE2 and LINE3. At this point, a single level, interdigitated capacitor is formed.

Figure 13:
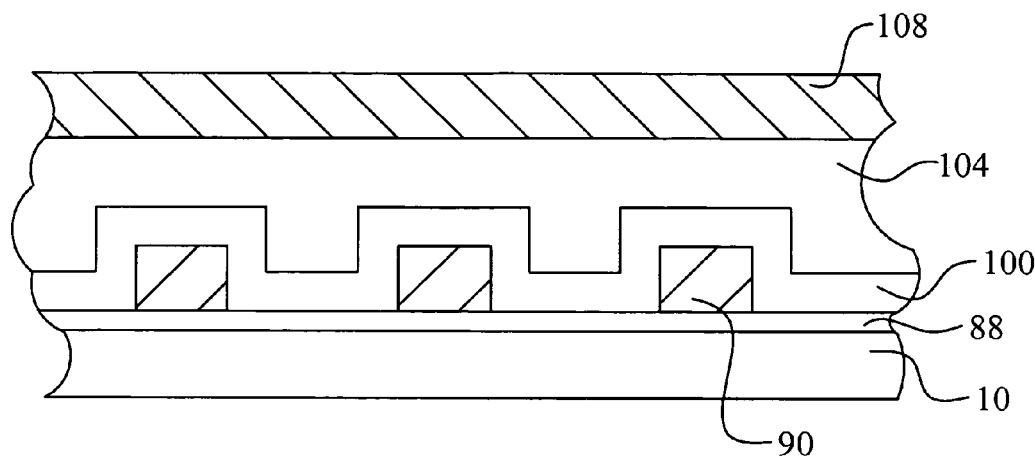

Referring now to FIG. 13, following the formation of the first conductive lines 90, a second dielectric layer 100 and 104 is formed. The second dielectric 100 and 104 is deposited overlying the first conductive lines 90. The second dielectric layer 100 and 104 preferably comprises more than one type of material. More preferably, the second dielectric layer 100 and 104 comprises a first interdielectric layer 100 and a second interdielectric layer 104.

The first and second interdielectric layers 100 and 104 preferably comprise materials such as TEOS oxide, fluorine-containing oxide, or carbon-containing oxide, or may comprise a hybrid material, such as fluorine-containing oxide, or carbon-containing oxide. Such materials may be formed by CVD, PVD, or by spin-on-coating. More preferably, the first and second interdielectric layers 100 and 104 comprise at least two, different materials. In one embodiment, at least one of the first and second interdielectric layers 100 and 104 is substantially oxygen-free. A second conductive layer 108 is deposited overlying the first and second interdielectric layers 100 and 104. The second metal layer 108 preferably comprises copper that is deposited by CVD, PVD, or by a plating process. Alternatively, the second conductor layer 108 may comprise aluminum or silicon or combinations of copper, aluminum, or silicon.

Figure 14:
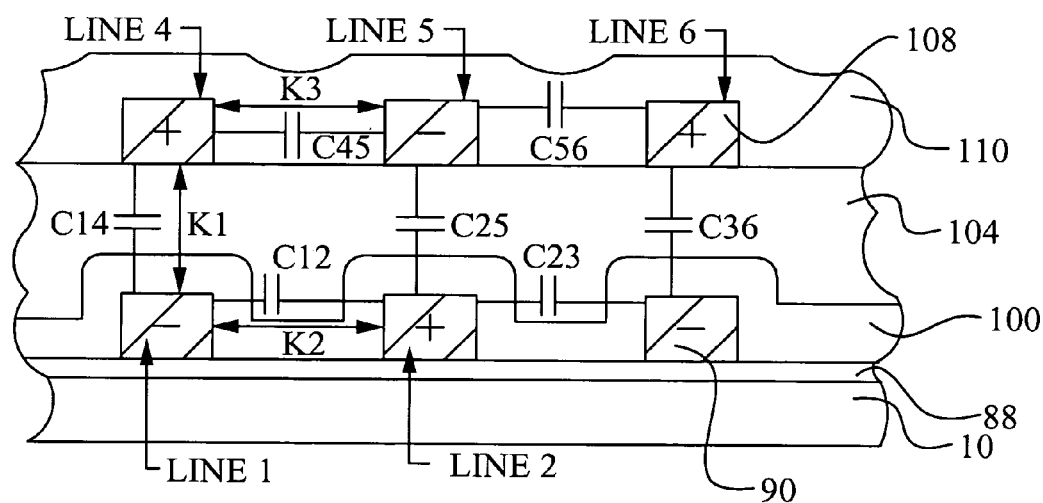

Referring now to FIG. 14, the second conductive layer 108 is patterned to thereby form a plurality of second conductive lines 108, LINE4, LINE5, LINE6, etc. This patterning step may be performed using a lithography and etch sequence as described above. Each of the second conductive lines 108 is connected to one terminal, not shown, of the planned capacitor devices. For example, LINE4 is connected to the positive (+) terminal, LINE5 is connected to the negative (−) terminal, and LINE6 is connected to the positive (+) terminal. Further, note that the adjacent second conductive lines 108 are connected to the opposite terminals. In this way, the interaction between each line 108 with the two lines adjacent to that line 108 creates two capacitors. For example, a first capacitor C45 is formed between LINE5 and LINE4 while a second capacitor C56 is formed between LINE5 and LINE6. A top dielectric layer 110 is then formed overlying the second conductive lines 108.

In addition to the interdigitated capacitors formed on each level of the structure, additional interdigitated capacitors are formed between the levels of the structure. As an additional feature, any second conductive line 108 overlying any first conductive line 90 is connected to an opposite terminal from that first conductive line 90. Therefore, LINE4 is connected to the positive terminal (+) while underlying LINE1 is connected to the negative terminal (−). Using this convention, additional capacitors are created between the lines on each layer. For example, capacitor C14 is between LINE1 and LINE4, capacitor C25 is between LINE2 and LINE5, and capacitor C36 is between LINE3 and LINE6.

As an additional feature, note that the design features several dielectric coefficients, K1, K2, and K3. The first dielectric coefficient K1 is between the upper lines 108 and the lower lines 90. The second dielectric coefficient K2 is between adjacent first conductive lines 90. The third dielectric coefficient K3 is between adjacent second conductive lines 108. In one embodiment of the present invention, the first dielectric coefficient K1 and the second dielectric coefficient K2 have different values. In another embodiment of the present invention, the first conductive lines 90 are spaced S1 less than about 1 micron while the second dielectric coefficient K2 is less than about 4. In another embodiment of the present invention, the second dielectric coefficient K2 is less than about 4.5. In another embodiment of the present invention, the second conductive lines 108 are spaced S2 less than about 1 micron while the first dielectric coefficient K1 is less than about 4. In another embodiment of the present invention, the second dielectric coefficient K2 is less than about 4.5. Finally, in another embodiment, the spaces S1 between adjacent first conductive lines 90 and the spaces S2 between adjacent second conductive lines 108 may be of different values.

The resulting interdigitated capacitor device of the second embodiment can now be described. The device comprises a plurality of first conductive lines 90 overlying a substrate 10. Each of the first conductive lines 90 is connected to one of the capacitor device terminals (−) or (+). The adjacent first conductive lines 90 are connected to opposite terminals. A plurality of second conductive lines 108 overlies the plurality of first conductive lines 90. Each of the second conductive lines 108 is connected to one of the capacitive device terminals (−) or (+). Adjacent second conductive lines 108 are connected to opposite terminals. Any second conductive line 108 overlying any first conductive line 90 is connected to an opposite terminal. A first interdielectric layer 100 overlies the substrate 10 and lies between the adjacent first conductive lines 90. A second interdielectric layer 104 lies between the first conductive lines 90 and the second conductive lines 108.

Figure 15:
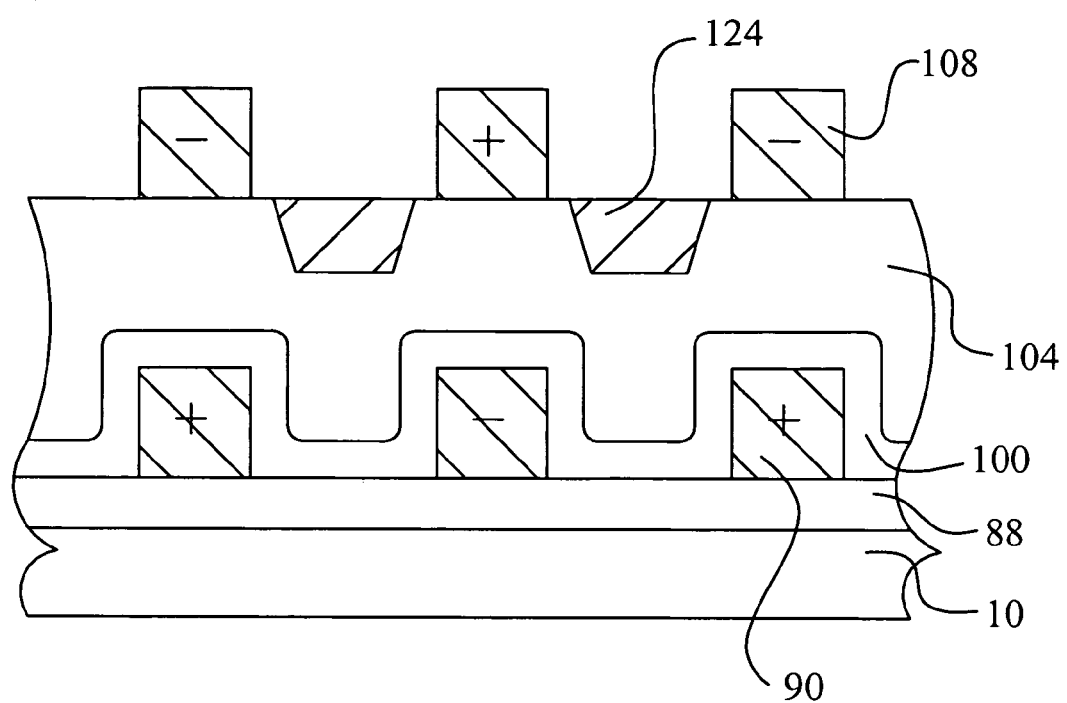
FIG. 15 illustrates a fourth preferred embodiment of the present invention.

Referring now to FIG. 15, a fourth embodiment of the present invention is illustrated. Additional conductive lines 124 may be formed in the second interdielectric layer 104 between the second conductive lines 108. These additional conductive lines 124 may be connected to terminals of the interdigitated capacitor or may be left unconnected. The presence of these additional conductive lines 124 will increase the capacitive coupling between the interdigitated lines 108 and 90.

The advantages of the present invention may now be summarized. An effective and very manufacturable method to form a high, unit area capacitor in the manufacture of an integrated circuit device is achieved. A high, unit area capacitor using minimal area of integrated circuit is achieved. The capacitor is formed using standard logic processes. The high, unit area capacitor is compatible with damascene technology. The high, unit area capacitor that is compatible with multiple material dielectric technology and with multiple material interconnect layer technology.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A capacitor device having two terminals and comprising:
- a plurality of first conductive lines overlying a substrate wherein each of said first conductive lines is connected to one of said capacitor device terminals, wherein adjacent said first conductive lines are connected to opposite said terminals, and wherein said first conductive lines comprise a plurality of conductive materials;
- a plurality of second conductive lines overlying said plurality of first conductive lines wherein each of said second conductive lines is connected to one of said capacitive device terminals, wherein adjacent said second conductive lines are connected to opposite said terminals, wherein any said second conductive line overlying any said first conductive line is connected to an opposite said terminal, and wherein said second conductive lines comprise a plurality of conductive materials;
- a first dielectric layer having a first dielectric coefficient and overlying said substrate and lying between said adjacent first conductive lines; and
- a second dielectric layer having a second dielectric coefficient and lying between said first conductive lines and said second conductive lines, wherein the first and second dielectric coefficients are different values.

2. The device according to claim 1 wherein said adjacent first conductive lines are spaced less than about 1 micron and wherein said first dielectric coefficient is less than about 4.

3. The device according to claim 1 wherein said first dielectric coefficient is less than about 4.5.

4. The device according to claim 1 wherein said adjacent second conductive lines are spaced less than about 1 micron and wherein said second dielectric coefficient is less than about 4.

5. The device according to claim 1 wherein said second dielectric coefficient is less than about 4.5.

6. A capacitor device having two terminals and comprising:
- a plurality of first conductive lines overlying a substrate wherein each of said first conductive lines is connected to one of said capacitor device terminals and wherein adjacent said first conductive lines are connected to opposite said terminals;
- a plurality of second conductive lines overlying said plurality of first conductive lines wherein each of said second conductive lines is connected to one of said capacitive device terminals, wherein adjacent said second conductive lines are connected to opposite said terminals, and wherein any said second conductive line overlying any said first conductive line is connected to an opposite said terminal;
- a first dielectric layer having a first dielectric coefficient and overlying said substrate and lying between said adjacent first conductive lines wherein said first dielectric layer comprises a plurality of materials; and
- a second dielectric layer having a second dielectric coefficient and lying between said first conductive lines and said second conductive lines wherein said second dielectric layer comprises a plurality of materials and the first and second dielectric coefficients are different values.

7. The device according to claim 6 wherein said adjacent first conductive lines are spaced less than about 1 micron and wherein said first dielectric coefficient is less than about 4.

8. The device according to claim 6 wherein said first dielectric coefficient is less than about 4.5.

9. The device according to claim 6 wherein said adjacent second conductive lines are spaced less than about 1 micron and wherein said second dielectric coefficient is less than about 4.

10. The device according to claim 6 wherein said second dielectric coefficient is less than about 4.5.

11. The device according to claim 6 wherein said adjacent first conductive lines are spaced between about 0.05 microns and about 1.2 microns.

12. The device according to claim 6 wherein said first and second conductive lines comprise different materials.

13. The device according to claim 6 wherein said first dielectric layer comprises an oxide-free material.

14. The device according to claim 6 wherein said first dielectric layer comprises silicon nitride or silicon carbide.

15. The device according to claim 6 wherein said second dielectric layer comprises TEOS oxide, fluoride-containing oxide, or carbon containing oxide.

16. The device according to claim 6 wherein said adjacent second conductive lines are spaced between about 0.05 microns and about 1.2 microns.

17. A capacitor device having two terminals, comprising:
- a plurality of first conductive lines comprising a first conductive material and overlying a substrate wherein each of said first conductive lines is connected to one of said capacitor device terminals, wherein adjacent said first conductive lines are connected to opposite said terminals;
- a plurality of second conductive lines comprising a second conductive material and overlying said plurality of first conductive lines wherein each of said second conductive lines is connected to one of said capacitive device terminals, wherein adjacent said second conductive lines are connected to opposite said terminals, wherein any said second conductive line overlying any said first conductive line is connected to an opposite said terminal, and wherein one of the first and second conductive materials comprises copper and the other one of the first and second conductive materials comprises aluminum;
- a first dielectric layer overlying said substrate and lying between said adjacent first conductive lines; and
- a second dielectric layer lying between said first conductive lines and said second conductive lines.

18. A capacitor device having two terminals and comprising:
- a plurality of first conductive lines overlying a substrate wherein each of said first conductive lines is connected to one of said capacitor device terminals and wherein adjacent said first conductive lines are connected to opposite said terminals;
- a plurality of second conductive lines overlying said plurality of first conductive lines wherein each of said second conductive lines is connected to one of said capacitive device terminals, wherein adjacent said second conductive lines are connected to opposite said terminals, and wherein any said second conductive line overlying any said first conductive line is connected to an opposite said terminal;
- a first dielectric layer overlying said substrate and lying between said adjacent first conductive lines;
- a second dielectric layer lying between said first conductive lines and said second conductive lines; and
- a plurality of conductive features disposed in the second dielectric layer and laterally within gaps between the second conductive lines.

19. The capacitor of claim 18 wherein the plurality of conductive features are constructed as conductive stripes.

20. The capacitor of claim 18 wherein the plurality of conductive features are electrically isolated from other conductive structures.

21. The capacitor of claim 18 wherein each of the plurality of conductive features is electrically connected to one of said capacitor device terminals.

* * * * *